United States Patent [19]

Kieser

[11] Patent Number: 4,521,717
[45] Date of Patent: Jun. 4, 1985

[54] APPARATUS FOR PRODUCING A MICROWAVE PLASMA FOR THE TREATMENT OF SUBSTRATES, IN PARTICULAR FOR THE PLASMA-POLYMERIZATION OF MONOMERS THEREON

[75] Inventor: Jörg Kieser, Albstadt, Fed. Rep. of Germany

[73] Assignee: Leybold-Heraeus GmbH, Cologne, Fed. Rep. of Germany

[21] Appl. No.: 445,339

[22] Filed: Nov. 29, 1982

[30] Foreign Application Priority Data

Oct. 17, 1981 [DE] Fed. Rep. of Germany ....... 3141312

[51] Int. Cl.³ .......................... H01J 7/46; H01J 19/80
[52] U.S. Cl. ................................. 315/39; 315/111.21; 315/111.41; 313/231.31
[58] Field of Search ................ 315/39, 111.41, 111.91, 315/111.81, 111.21; 313/231.31; 219/121 PL

[56] References Cited

U.S. PATENT DOCUMENTS

| | | | |
|---|---|---|---|
| 3,541,372 | 11/1970 | Omura et al. ..................... 315/39 X |
| 3,814,983 | 6/1974 | Weissfloch et al. ................... 315/39 |
| 3,872,349 | 3/1975 | Spero et al. ........................... 315/39 |
| 3,911,318 | 10/1975 | Spero et al. ........................... 315/39 |
| 4,042,850 | 8/1977 | Ury et al. ............................... 315/39 |
| 4,207,452 | 6/1980 | Arai ...................................... 315/39 |
| 4,359,668 | 11/1982 | Ury ....................................... 315/39 |

Primary Examiner—Saxfield Chatmon
Attorney, Agent, or Firm—Felfe & Lynch

[57] ABSTRACT

The invention relates to apparatus for producing a microwave plasma for the treatment of substrates, and in particular for the plasma polymerization of monomers for coating substrates. The apparatus consists of a reaction chamber with a carrier for conveying the substrates and a way for maintaining an atmosphere of ionizable gases and monomers. The apparatus also has a first and at least one second wave-guide structure which are arranged at opposite acute setting angles to the surface of the substrate carrier and are each connected at one end to a microwave transmitter by way of a hollow conductor. Thus, the treatment intensities, i.e. the rates of deposition, are superposed, and this leads to greater uniformity in the properties of the product. The apparatus may also include angling the wave-guide structures toward each other and staggering crossbar structures in the wave-guides for further improvement.

13 Claims, 4 Drawing Figures

APPARATUS FOR PRODUCING A MICROWAVE PLASMA FOR THE TREATMENT OF SUBSTRATES, IN PARTICULAR FOR THE PLASMA-POLYMERIZATION OF MONOMERS THEREON

The invention concerns apparatus for producing a plasma with microwaves for the treatment of substrates and, more particularly, for the plasma-polymerization of monomers for coating the substrates with the polymer that is formed therefrom.

In general, the apparatus consists of a reaction chamber for conveying the substrates in an atmosphere of ionizable gases and monomers, and an elongated slow wave structure extends transversely of the conveying direction of the substrates, is disposed at an acute setting angle to the surface of the substrates, and is connected at one of its ends by way of a first hollow conductor to a microwave transmitter.

Apparatus of this kind is known from U.S. Pat. No. 3,814,983. In it, the wave-guide structure consists of two straight stringers between which extend a row of crossbars. The stringers are conductively connected respectively to one of two median conductors which introduce energy from a microwave transmitter into the slow wave structure. The same patent publication discloses the idea of arranging a wall (glass tube) which is penetrable by microwaves between the wave-guide structure and the microwave plasma. If an ionizable gas and a polymerizable monomer are present in the glass tube, polymers can be produced.

The same patent publication also discloses a system for coating both sides of thin, flat substrates in the form of strips, films or plates. In this system, a slow wave structure is arranged at each of the two opposite sides of the substrate.

However, in the treatment, i.e. coating, of substrates of large area, it is essential that the intensity of treatment, i.e. the rate of deposition of the coating material, be as uniform as possible across the entire width of the substrate. This presupposes a correspondingly uniform input of power into the plasma over the width of the substrate.

In U.S. Pat. No. 3,814,983, it is proposed, for the purpose of achieving a uniform input of power into the plasma, to incline the slow wave structure relative to the surface of the substrate at a setting angle determinable by experiment. The setting angle can be so ascertained for predetermined discharge parameters, so that a constant input of power over the entire length of the slow wave structure is rendered possible for these discharge parameters. However, as soon as the discharge parameters change, for example when the monomers, the pressure or the power input vary, those reference values that determine the setting angle of the wave-guide structure also change. It follows from this that, with an unchanged setting angle, the input of power has an exponential trend which has a very adverse effect as regards the uniformity of the thickness of the coating in the direction in which the wave-guide structure extends. The inputs of power into the plasma may vary at the two ends of the structure in this way in a ratio of as much as 1 : 10. Such differences are unacceptable in the large-scale coating of substrates.

The object of the present invention is, therefore, to provide apparatus of the initially described kind that is improved along the lines of enabling the treatment intensity, i.e., the rate of deposition of polymers, to be as uniform as possible over the entire width of the substrate. In the case where a plurality of smaller substrates are laid out flat and subjected to the treatment process, the same requirement applies in principle to all of the substrates as regards distribution of the intensity of treatment, i.e. the rate of deposition.

According to the invention in apparatus as initially described, this object is achieved in that at least one second elongate slow wave structure is arranged alongside the first slow wave structure on the same side of the substrates. The second slow wave structure also extends transversely of the conveying direction of the substrates but is disposed at an opposite acute setting angle to the surface of the substrates. It is connected to a microwave transmitter by way of a second hollow conductor.

Essentially, the invention consists in providing two wave-guide structures in an anti-parallel arrangement on the same side of the substrates. Thus, the energy inputs of the two structures are superposed one upon the other, and this would not be possible when the two structures are arranged on opposite sides of the substrates.

When the teaching of the invention is applied, that factor that defines the strength of the coupling of energy to the plasma no longer varies exponentially transversely across the substrates, but only to an extent that corresponds to the superposing of the two inputs of power. If the input from power of each structure varies transversely across the substrates in accordance with an e-function, then the superposition of these two functions which vary in opposite directions can be represented by a catenary curve, which corresponds approximately to a cosine hyperbola.

If, for example, when only one wave-guide structure is used and because of incorrect adjustment, the ratio of the energy input from one edge of the substrates to that at the other edge is "n" (e.g. $n = P_{max}:P_{min} = 2, 4,$ or $6$), then when use is made of the two anti-parallel structures in accordance with the invention and when the same incorrect adjustment occurs at the middle of the substrates (which then is the most unfavourable area), a percentage deviation "b", as shown in the following Table, occurs:

| n | b (%) |
| --- | --- |
| 2 | 5.2 |
| 4 | 20 |
| 6 | 45 |

This means that, where a single wave-guide structure would result in non-uniformity of the power inputs in a ratio of 1 : 2, the anti-parallel wave-guide structures of the invention produce a non-uniformity of only approximately 5%. In this connection, it should be noted that even when $n=2$, this is generally unacceptably great.

Since the deposition rate is closely correlated to the power input in plasma polymerization, it is possible, in this manner, not only to achieve a higher rate of deposition of the coating material, but to provide considerably greater uniformity of coating across the substrates.

The conditions as regards the superposing of the two energy inputs can be further improved if the two slow wave structures are set at an angle to each other such that planes normal to the medians thereof intersect at a straight line which extends parallel to the surfaces of the substrates and at right angles to the conveying direction. With this arrangement, separated plasma-filled spaces are no longer formed; instead, the same space is simultaneously subjected to the effect of the two slow wave structures.

However, with slow wave structures of this kind, there arises a further problem which is caused by the finite space between the crossbars. This results in a micro-wavefield pattern of the electrical field strength that has the same periodicity as the crossbar spacing. Over the length corresponding to the distance between crossbars, the energy input varies by approximately the factor 2. The effect on a deposited layer can be roughly indicated by the statement that the variation in the thickness of the layer corresponds to a wave having peaks which correspond to the distance between crossbars.

To solve this problem in accordance with a further feature of the invention, it is proposed that the two wave-guide structures be displaced from each other transversely of the conveying direction of the substrate(s) by a distance equal to half of the space between crossbars. In this way the microwave field pattern is substantially suppressed by superposing. This would also be the case if the structures were widely spaced from each other in the direction in which the substrate(s) is conveyed, but as already stated, it is possible, however, to improve the results if the structures act on a common plasma-filled space.

DESCRIPTION OF THE DRAWINGS

Further advantageous forms of the subject-matter of the invention are set forth in conjunction with a preferred embodiment of the invention which will now be described in greater detail with reference to the attached drawings, in which.

DESCRIPTION OF THE PREFERRED EMBODIMENTS

Figure 1:
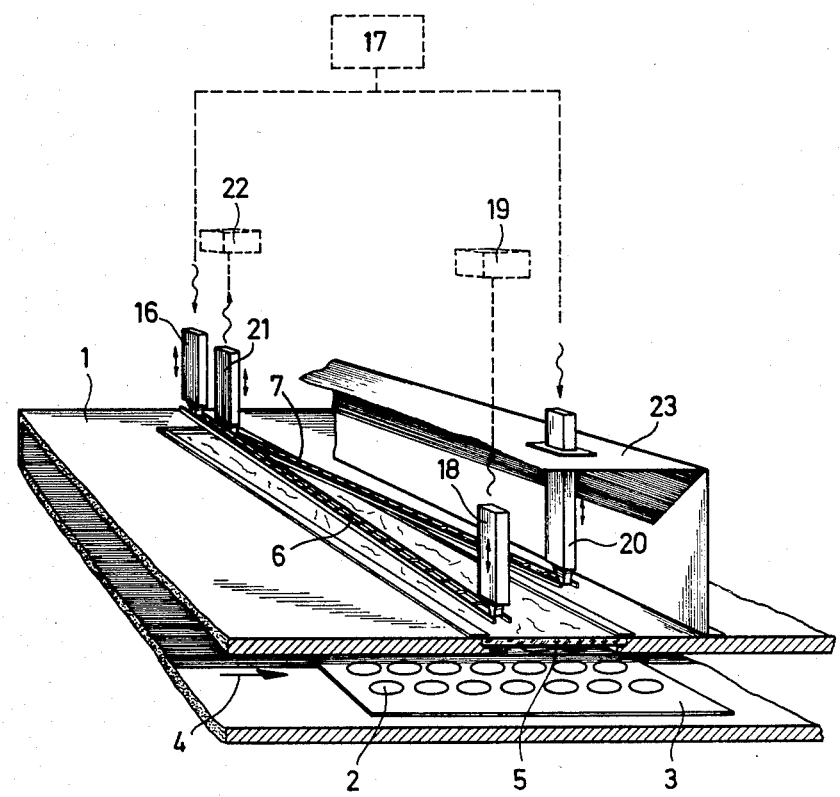
FIG. 1 is a perspective view of one preferred embodiment.

FIG. 1 illustrates a reaction chamber 1, in which are arranged a plurality of substrates 2 laid flat on a planar substrate carrier 3. The substrates 2 can be moved through the reaction chamber 1, by means of the substrate carrier 3, in the direction indicated by the arrow 4.

The substrate carrier 3 can be moved between a supply magazine, not shown, and a receiving magazine, likewise not shown, which are arranged one at each end of the reaction chamber 1. However, feed locks could be provided at the ends of the reaction chamber 1.

However, instead of the separate substrates 2, it is possible to deal with a single substrate of large area, for example a film which is wound off a supply drum, not illustrated, onto a receiving drum, likewise not illustrated. The rolls of film can be housed in special chambers; it is, however, also possible to arrange the rolls of film outside the reaction chamber 1 and to move the film into and out of the reaction chamber through slotted seals of three-stage construction.

The construction of reaction chamber and any necessary locks or seals form part of the prior art, however, so that a detailed description of them here is unnecessary.

The reaction chamber 1, made of metal, is provided with a window 5 made of a material penetrable by microwaves, such as quartz glass, aluminium oxide ceramic material, polytetrafluoroethylene, etc. The window is rectangular in plan view, and its length is at least equal to the width of the substrates 2, i.e. of the substrate carrier 3, transversely of the conveying direction (arrow 4).

Figure 2:
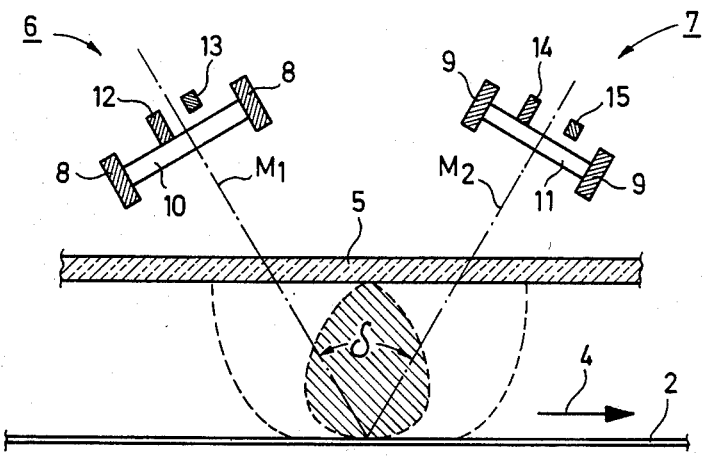
FIG. 2 is a partial cross-section through another embodiment.

A first wave-guide structure 6 and a second wave-guide structure 7 are arranged above the window 5. As shown in FIG. 2, each of two similar wave-guide structures each consist of two straight stringers 8; 9, which are disposed parallel to each other, and between which extend sets of crossbars 10; 11 of equal length which interconnect the stringers; all are metal.

The individual crossbars of sets 10; 11 are alternately electrically conductively connected between two respective pairs of median conductors 12, 13; 14, 15 as shown only in FIG. 2. These median conductors are omitted from FIG. 1 for the sake of making the drawing more clear. The form and arrangement of such wave-guide structures are fully described in U.S. Pat. No. 3,814,983 and are illustrated in particular in FIGS. 4 to 8 thereof.

As shown in FIG. 1, the first wave-guide structure 6 is connected to a microwave transmitter 17 by way of a hollow conductor 16, the connection being indicated only symbolically by a broken line. The important part of the microwave transmitter 17 is a magnetron. The method of coupling the wave-guide structure 6 to the hollow conductor 16 also forms part of the prior art and is illustrated, for example, in FIGS. 4 and 5 of U.S. Pat. No. 3,814,983. The other end of the first wave-guide structure 6 is connected, by a further hollow conductor 18, to what is known as a reactive load 19 which produces a microwave short-circuit. The wave-guide structure 6 extends towards the window 5 and the substrate carrier 3 at an acute setting angle, the greatest distance being at that end at which the hollow conductor 16 is located. The setting angle can be varied by displacing the hollow conductor 16 in the directions indicated by the double-headed arrow shown on its left. The setting angle is so selected that, assuming the discharge parameters to be constant, uniform input of energy into the plasma takes place over the entire length of the wave-guide structure.

The plasma is formed within the reaction chamber 1 in which, in addition to an ionizable gas, such as argon, there is also provided a monomeric component which can be polymerized under the action of the plasma. The setting of suitable operational parameters likewise forms part of the prior art and is described for example in U.S. Pat. No. 3,814,983.

The second wave-guide structure 7—likewise disposed transversely of the direction in which the substrates are moved—is arranged alongside the first wave-guide structure 6; however, it extends at an opposite, equal acute angle to the surface of the substrate carrier. That end of the second wave-guide structure 7 that is most remote from the surface of the substrate carrier is likewise connected in a similar manner to the microwave transmitter 17 by way of a hollow conductor 20. The other end of the wave-guide structure is connected, in a likewise similar manner, to a further reactive load 22 by way of a further hollow conductor 21. For the purpose of enabling the wave-guide structures 6 and 7 to be precisely angled relative to the surface of the substrate, all of the hollow conductors 16, 18, 20 and 21 are designed to be longitudinally displaceable in the directions indicated by the double-headed arrows. Fine adjustment of the thickness of the coating can also be achieved by adapting the power distribution to suit the two structures.

In the arrangement shown in FIG. 1, the median planes of the two wave-guide structures 6 and 7 that extend at right angles to the crossbars are disposed parallel to each other and at right angles to the surface of the substrate carrier. In this way two elongate plasma-filled spaces, through which the substrates pass in succession, are created below the window 5. It will be understood that the wave-guide structures 6 and 7, together with the hollow conductors provided at the ends lie, in projection, within the cross-section of the window 5. Those hollow conductors 16; 20, by way of which power is fed into the plasma, are disposed at opposite ends of the substrate carrier 3 as viewed transversely of the conveying direction (arrow 4).

The two wave-guide structures 6 and 7 are surrounded by a common screen 23 which excludes microwaves, only part of this screen being shown in the drawing.

FIG. 2 shows a modified form of the FIG. 1 equipment. Although the two wave-guide structures 6 and 7 are in construction identical to those depicted in FIG. 1, the two median planes $m_1$ and $m_2$, which extend at right angles to the crossbars 10; 11, are set at such an angle $\delta$ to each other that they intersect at a straight line which is parallel to the surface of the substrate carrier and at a right angle to the conveying direction (arrow 4). The boundaries of the resulting two plasma-filled spaces are indicated roughly by broken lines. The two plasma-filled spaces intersect each other over a shaded zone, but they do not completely cover each other. More precisely, the line of intersection of the median planes $M_1$ and $M_2$ lies directly on the surface of the substrate or substrates on carrier 3. The intersection or overlapping of the plasma-filled spaces can, however, be further increased if the two wave-guide structures 6 and 7 are brought closer together, the angle of the median planes remaining the same. The line of intersection of the two median planes then moves away from the surface of the substrate or substrates until finally a common plasma-filled space is created, and this can be regarded as the ideal case. Similar conditions can be achieved if the median planes $M_1$ and $M_2$ are swung relative to each other, the angle $\delta$ being increased.

Figure 3:
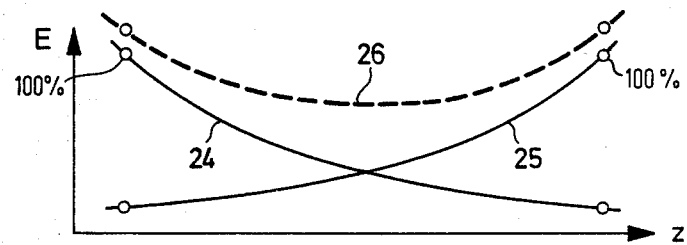
FIG. 3 shows, in the form of a graph, the energy outputs of each preferred embodiment.

FIG. 3 illustrates the energy inputs E of the two wave-guide structures 6 and 7 for the case wherein the setting angles do not correspond precisely to the discharge parameters. The substrate carrier dimension transversely of the conveying direction is shown on the z axis. The points having a power input of 100% are marked. The positions of these points correspond to the edges of the substrate or substrates, as seen in the conveying direction. The line 24, corresponding to an e-function, represents the energy input of the wave-guide structure 6, whereas the line 25 represents the opposite function of the energy input, of the wave-guide structure 7. It will be seen that the energy input towards the opposite edge of the substrate drops to a fraction of the maximally possible energy input of 100%. However, the overlapping of the two curves leads to the curve 26, which represents a kind of catenary. It will be seen that the reduction in the power input at the middle of the substrate is considerably less pronounced, so that a very much better treatment intensity, i.e. deposition rate, is achieved. In this connection, it has to be borne in mind that the conditions are illustrated in an exaggerated manner in FIG. 3 so as to present the situation more clearly. The better the setting angle of the wave-guide structures is adjusted to suit the discharge parameters, the more favourable will be the trend of the curve. In each case, however, no deviations at all are present in the zone of the two outer edges of the substrate, and the deviation at the middle of the substrate amounts only to a fraction of the deviations that would occur without the superposed arrangement.

Figure 4:
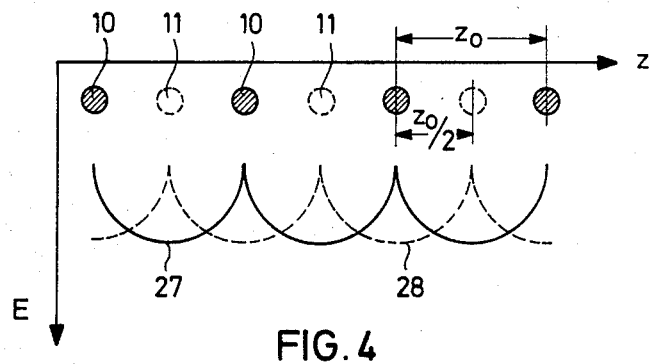
FIG. 4 shows a partial, projected cross section of the embodiment shown in FIG. 2 and the energy output therefrom.

In FIG. 4, the crossbars 10 of the wave-guide structure 6 are drawn in solid lines, whereas the crossbars 11 of the wave-guide structure 7 are shown in broken lines. In each case the crossbars are shown in section along the median planes $M_1$; $M_2$, but the sections are projected together. It will be seen that the crossbars of the two wave-guide structures 6 and 7 are displaced towards each other by an amount corresponding to half the distance between crossbars, the full distance between crossbars being designated as $Z_O$. Because of the finite spacing of the crossbars, the plasma intensity of the respective wave-guide structures 6 having the crossbars 10, 11 has a microwave field pattern, which is represented by the respective set of curves 27, 28. The effective distribution of energy, achieved by the superposed arrangement, then corresponds to the envelope common to the two sets of curves 27 and 28. This means that net variation of the discharge intensity is substantially suppressed by the displacement of the crossbars.

What is claimed is:

1. In apparatus for producing a plasma with microwaves for treating one or more substrates arranged on a planar substrate carrier with the plasma, the improvement comprising:
   (a) a first elongated slow wave structure for radiating plasma-producing microwaves toward the substrate carrier having a longitudinal axis which is inclined to the plane of the substrate carrier at an acute setting angle; and
   (b) a second elongated slow wave structure for radiating plasma-producing microwaves toward the substrate carrier having a longitudinal axis which is inclined to the plane of the substrate carrier at an opposite acute setting angle,
   (c) the first and second slow wave structures being side by side on the same side of the substrate carrier,
      whereby the intensity of the microwave from the slow wave structures vary oppositely along the axes thereof to minimize the net variation of the plasmas on the substrates.

2. Apparatus as in claim 1 wherein the setting angles are equal.

3. Apparatus as in claim 2, and further comprising:
   reaction chamber means for permeably receiving the microwaves and containing an ionizable gas, a polymerizable monomer, and means for moving the substrate carrier in a direction transverse to the axes of the wave-guide structures,
   whereby the monomer is converted to a polymer and deposited as a coating on the substrates.

4. Apparatus as in claim 1, wherein the slow wave structures each comprise means for defining a longitudinal median plane of the microwaves therefrom which median planes are parallel to each other.

5. Apparatus as in claim 4, and further comprising:
reaction chamber means for permeably receiving the microwaves and containing an ionizable gas, a polymerizable monomer, and means for moving the substrate carrier in a direction transverse to the axes of the slow wave structures,
whereby the momomer is converted to a polymer and deposited as a coating on the substrates.

6. Apparatus as in claim 1, wherein the slow wave structures each comprise means for defining a longitudinal median plane of the microwaves therefrom, the median planes intersecting in a line which is parallel to the plane of the substrate carrier,
whereby the microwave from the slow wave structures may overlap at least at a portion of the substrate carrier.

7. Apparatus as in claim 6, wherein the median planes intersect in a line on the substrate carrier.

8. Apparatus as in claim 7, and further comprising:
reaction chamber means for permeably receiving the microwaves and containing an ionizable gas, a polymerizable monomer, and means for moving the substrate carrier in a direction transverse to the axes of the slow wave structures,
whereby the monomer is converted to a polymer and deposited as a coating on the substrates.

9. Apparatus as in claim 1, wherein each slow wave structure comprises:
(a) a pair of stringers extending parallel to the axis of the slow wave structure; and
(b) crossbars extending transversely between the stringers,
(c) the crossbars having crossbar axes in the direction between the stringers of the respective slow wave structures which are spaced from the crossbar axes of the other slow wave structure.

10. Apparatus as in claim 9, wherein the spacing between the crossbar axes is the same.

11. Apparatus as in claim 10, and further comprising:
reaction chamber means for permeably receiving the microwaves and containing an ionizable gas, a polymerizable monomer, and means for moving the substrate carrier in a direction transverse to the axes of the slow wave structures,
whereby the monomer is converted to a polymer and deposited as a coating on the substrates.

12. In apparatus for producing a plasma with microwaves for treating one or more substrates arranged on a planar substrate carrier, the improvement comprising:
(a) a first elongated slow wave structure for radiating plasma-producing microwaves toward the substrate carrier having a longitudinal axis which is inclined to the plane of the substrate carrier at an acute setting angle;
(b) a second elongated slow wave structure for radiating plasma-producing microwaves toward the substrate carrier having a longitudinal axis which is inclined to the plane of the substrate carrier at an equal, but opposite acute setting angle,
(c) the first and second slow wave structures being side by side on the same side of the substrate carrier,
whereby the intensity of the microwave from the slow wave structures vary oppositely along the axes of the slow wave structures to minimize the net variation of the plasmas on the substrates;
(d) the slow wave structures each comprising means for defining a median plane of the microwaves therefrom such that the median planes are parallel to each other,
a pair of stringers extending parallel to the axis of each slow wave structure,
(f) crossbars extending transversely between the stringers of each slow wave structure,
(g) the crossbars having crossbars axes in the direction between the stringers of the respective slow wave structures which are spaced from the crossbar axes of the other wave-guide structure,
(h) the median plane of each slow wave structure being normal to the crossbar axes thereof; and
(i) reaction chamber means for permeably receiving the microwaves and containing an ionizable gas, a polymerizable monomer, and means for moving the substrate carrier in a direction transverse to the axes of the slow wave structures,
whereby the monomer is converted to a polymer and deposited as a coating on the substrates.

13. In apparatus for producing a plasma with microwaves for treating one or more substrates arranged on a planar substrate carrier, the improvement comprising:
(a) a first elongated slow wave structure for radiating plasma-producing microwaves toward the substrate carrier having a longitudinal axis which is inclined to the plane of the substrate carrier at an acute setting angle;
(b) a second elongated slow wave structure for radiating plasma-producing microwaves towards the substrate carrier having a longitudinal axis which is inclined to the plane of the substrate carrier at an equal, but opposite acute setting angle,
(c) the first and second slow wave structures being side by side on the same side of the substrate carrier,
whereby the intensity of the microwave from the slow wave structures vary oppositely along the axes of the slow wave structures to minimize the net variation of the plasmas on the substrates;
(d) the slow wave structures each comprising means for defining a median plane of the microwaves therefrom such that the median planes intersect in a line on the substrate carrier,
(e) a pair of stringers extending parallel to the axis of each slow wave structure,
(f) crossbars extending transversely between the stringers of each slow wave structure,
(g) the crossbars having crossbar axes in the direction between the stringers of the respective slow wave structures which are spaced from the crossbar axes of the other slow wave structure,
(h) the median plane of each slow wave structure being normal to the crossbar axes thereof; and
(i) reaction chamber means for permeably receiving the microwaves and containing an ionizable gas, a polymerizable monomer, and means for moving the substrate carrier in a direction transverse to the axes of the slow wave structures,
whereby the monomer is converted to a polymer and despoited as a coating on the substrates.

* * * * *

UNITED STATES PATENT AND TRADEMARK OFFICE
CERTIFICATE OF CORRECTION

PATENT NO. : 4,521,717
DATED : June 4, 1985
INVENTOR(S) : Jorg Kieser

It is certified that error appears in the above-identified patent and that said Letters Patent is hereby corrected as shown below:

Title page:

Foreign Application Priority data

FROM  October 17, 1981 [DE] Federal Republic of Germany 3141312

TO  December 4, 1981 [DE] Federal Republic of Germany 3147986.

Signed and Sealed this

Seventeenth Day of April, 1990

Attest:

HARRY F. MANBECK, JR.

*Attesting Officer*  *Commissioner of Patents and Trademarks*